United States Patent [19]
Mick

[11] Patent Number: 5,807,136
[45] Date of Patent: Sep. 15, 1998

[54] SPACE SAVING CONNECTOR LAYOUT

[75] Inventor: John R. Mick, San Jose, Calif.

[73] Assignee: Integrated Device Technology, Inc., Santa Clara, Calif.

[21] Appl. No.: 649,394

[22] Filed: May 17, 1996

[51] Int. Cl.$^6$ .................................................. H01R 13/73
[52] U.S. Cl. ............................................................ 439/571
[58] Field of Search ........................... 439/567, 571–573, 439/78

[56] References Cited

U.S. PATENT DOCUMENTS

| | | | |
|---|---|---|---|
| 3,842,392 | 10/1974 | Aldridge et al. | 339/47 R |
| 4,173,387 | 11/1979 | Zell | 439/78 |
| 4,363,530 | 12/1982 | Verhoeven | 339/17 C |
| 4,568,134 | 2/1986 | DiMondi | 439/78 |
| 4,967,262 | 10/1990 | Farnsworth | 357/80 |
| 5,080,611 | 1/1992 | Hypes | 439/567 |
| 5,098,311 | 3/1992 | Roath et al. | 439/289 |
| 5,244,413 | 9/1993 | Clark | 439/567 |
| 5,254,016 | 10/1993 | Ganthier | 439/567 |
| 5,316,487 | 5/1994 | Clark | 439/573 |
| 5,482,474 | 1/1996 | Yohn et al. | 439/567 |
| 5,505,627 | 4/1996 | Honma | 439/573 |

*Primary Examiner*—Gary F. Paumen
*Attorney, Agent, or Firm*—Skjerven, Morrill, MacPherson, Franklin & Friel LLP

[57] ABSTRACT

Two connectors located directly opposite each other on opposite sides of a printed circuit board are attached together and to the circuit board by means of keys integral to the connectors.

16 Claims, 6 Drawing Sheets

1

SPACE SAVING CONNECTOR LAYOUT

FIELD OF THE INVENTION

This invention relates to electrical connectors and particularly relates to connectors which are mounted, in a back to back arrangement, on opposite surfaces of a circuit board.

BACKGROUND OF THE INVENTION

It is known to use mechanical fasteners to attach two surface mountable connectors directly opposite each other on opposite sides of a printed circuit board. For example, Hypes, in U.S. Pat. No. 5,080,611, discloses an arrangement in which so-called boardlocks are used to attach a first connector to a board and then to attach a second connector to the same location on the other side of the board.

A boardlock, as disclosed in Hypes, is a flat piece of metal stamped from sheet metal of a certain thickness. A boardlock has an elongated U shape and the gap between the arms of the U is somewhat wider than the thickness of the sheet metal. There are protrusions or barbs on the outsides of the arms near the open end of the U. As the open end of the U is inserted into a cylindrical through-hole in a circuit board, a hole which is slightly narrower than the boardlock, the boardlock is compressed, i.e. the arms are forced nearer together, by the insertion force and the barbs grip the interior wall of the through-hole. A second boardlock can be inserted into the same hole from the other side of the board, provided the gap or slot in the second boardlock is aligned with the slot in the first and provided the second boardlock is rotated ninety degrees relative to the first.

Each connector has two mounting holes corresponding to two mounting holes in the circuit board. One of the connectors is placed on the board so that the mounting holes in the connector are aligned with the mounting holes in the board. A boardlock is inserted, open end first, through one of the mounting holes in the connector into one of the mounting holes in the circuit board. The gap in the boardlock allows the boardlock to contract as it enters the hole in the circuit board and the barbs on that part of the boardlock which enters the hole dig into the material of the board, thus locking the boardlock and connector in place. The attachment of the first connector to the circuit board is completed by the insertion of a second boardlock through the second hole in the connector into the second hole in the board. Two more boardlocks are used in the same fashion to attach the second connector on the opposite side of the board, there then being two boardlocks in each of the two mounting holes in the board as described above.

Ganthier in U.S. Pat. No. 5,254,016 discloses an arrangement in which two connectors on opposite sides of a board are attached together and to the board by male and female fasteners passed through two mounting holes in the connectors and in the boards.

Both the Hypes and Ganthier arrangements require, in addition to the two connectors, four other separate fastener pieces to secure the connectors in place on the board. There are costs associated with procuring, stocking, handling and assembling these fasteners.

SUMMARY OF THE INVENTION

In accordance with the present invention, connectors are provided with integral fasteners so that a connector on one side of a printed circuit board can be mechanically fastened to a like connector on the other side of the board by bringing the fasteners of the two connectors together through a hole or holes in the board and by causing the fasteners to engage. Thus, the present invention provides connectors for attachment opposite each other on opposite sides of a printed circuit board without the use of any separate fasteners. Thus, the costs of procuring, stocking, handling and assembling separate fasteners are avoided. The present invention also provides a connector consisting of multiple connectors formed together in a single housing for each side of the board.

DETAILED DESCRIPTION OF THE INVENTION

Figure 1A:
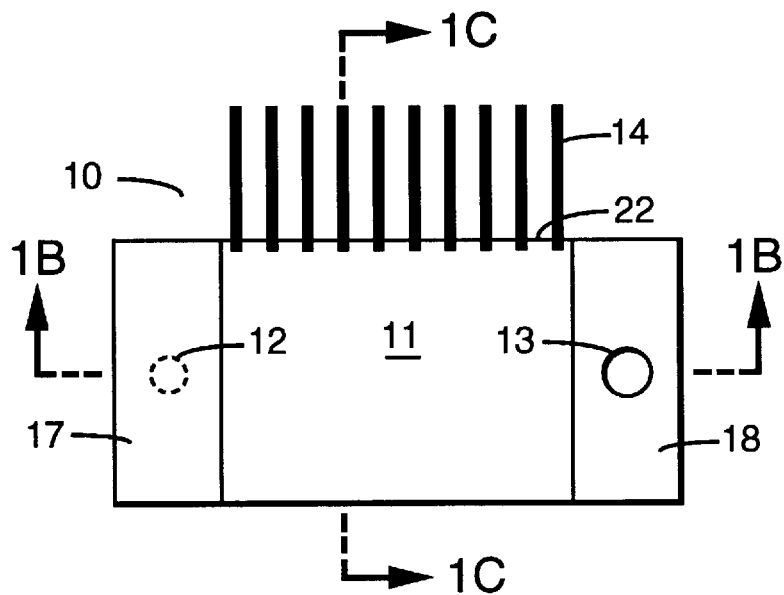
FIG. 1A shows a view of a connector in accordance with the invention as seen from above on a circuit board.
Figure 1B:
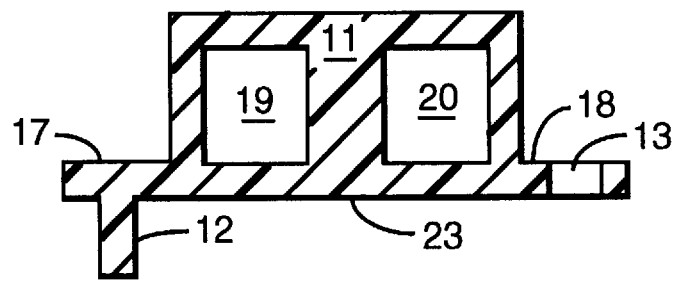
FIG. 1B shows a cross section of a connector taken as indicated by the arrows 1B in FIG. 1A.
Figure 1C:
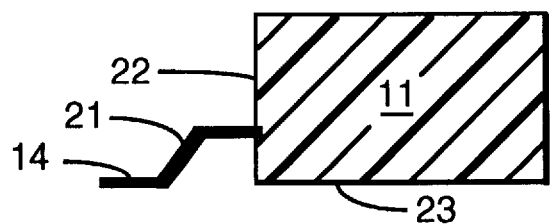
FIG. 1C shows a cross section of a connector taken as indicated by the arrows 1C in FIG. 1A.

FIG. 1A shows a connector in accordance with the invention. The view is that seen from above when looking at a connector on a circuit board (not shown). FIGS. 1B and 1C show cross sections of the connector of FIG. 1A, taken as indicated by the arrows 1B and 1C, respectively. The connector 10 consists of a connector body 11 containing connectors 19 and 20, surface mount pins 14, flanges 17 and 18, and a fastener consisting of a key 12 and a keyhole 13.

The surface mount pins 14 extend laterally from the lateral surface 22 of the body 11 as shown in FIGS. 1A and 1C. The offset 21, in the surface mount pins 14, allows the pins 14 to reach conductive traces (not shown) on a printed circuit board (not shown). Alternatively, the surface mount pins 14 may extend laterally from the bottom surface 23 of the connector rather than from the lateral surface 22.

The connector 10 as shown in FIG. 1B includes two female connectors 19 and 20. These may be RJ-45 connectors or any other suitable connectors. It should be noted that any number or combination of female and or male connectors may be included in connector 10 as required.

The key 12 is the male portion of a fastener and the keyhole 13 is the corresponding female portion of a fastener. The key 12 and keyhole 13 have, by design, specific shapes which are well known and which ensure that once a key 12 is inserted into a keyhole 13 it cannot readily be removed. Some examples of fastener shapes suitable for use in connectors in accordance with the present invention are shown in FIGS. 6A, 6B, 7 and 8 but in all other figures the key 12 and keyhole 13 are shown, for clarity, as simple cylindrical shapes. The key 12 (FIG. 1B) is an integral part of the connector 10. The connector 10, including the connector body 11, the flanges 17 and 18, and the key 12, can be formed as a single unit by injection molding. Alternatively, the key 12 can be made separately of another material, such as metal or plastic, and then joined to the flange 17 to become an integral part of the connector 10. In any case, each connector 10 contains an integral male fastener or key 12 and an integral female fastener or keyhole 13, the key 12 being spaced apart from the keyhole 13 by a specific distance. Thus, when the bottom surfaces 23 of two identical connectors 10 are opposed and the key 12 of each connector is aligned with the keyhole 13 of the opposing connector, the key 12 of each connector 10 can be inserted into the corresponding keyhole 13 of the opposing connector 10, thus fastening the two connectors together.

Figure 2A:
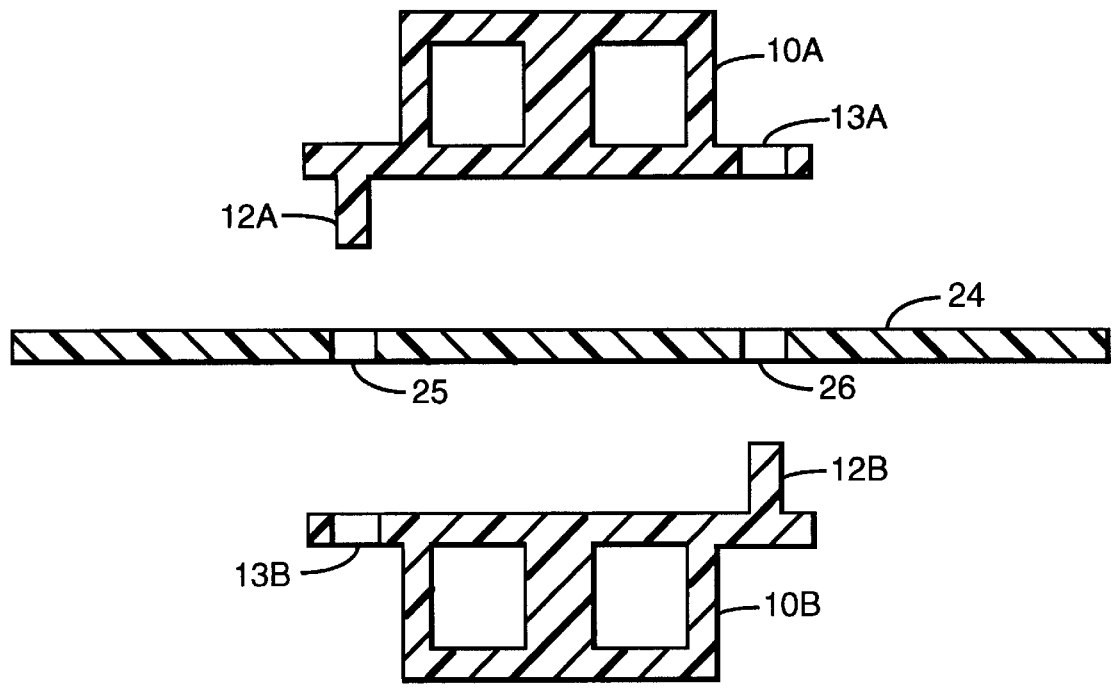
FIG. 2A shows a cross section of a circuit board and two connectors in accordance with the invention as they are aligned in preparation for assembly.

FIG. 2A shows a cross section of a circuit board 24 and two connectors 10A and 10B as they are aligned in preparation for assembly. The cross section passes through two mounting holes 25 and 26 in the circuit board 24. The bottom surfaces 23A and 23B of the connectors 10A and 10B face opposite sides of the board 24 and key 12A is aligned with hole 25 and keyhole 13B, and likewise key 12B is aligned with hole 26 and keyhole 13A.

The assembly may be completed by inserting both keys 12A and 12B through the board holes 25 and 26 and then forcing the keys 12A and 12B into the keyholes 13B and 13A, respectively Alternatively, the assembly may be completed by first attaching one connector, say connector 10A, to the board 24 by inserting key 12A through board hole 25 so that the key 12A grips the board 24 and the keyhole 13A aligns with board hole 26, and then attaching connector 10B.

Figure 2B:
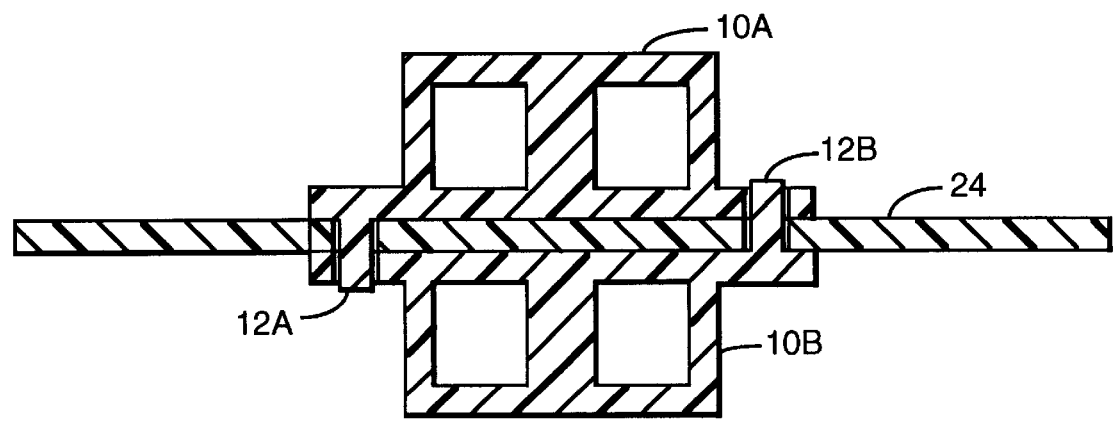
FIG. 2B shows a cross section of the circuit board and connectors of FIG. 2A after the assembly is completed.

FIG. 2B shows the same board 24 and connectors 10A and 10B after the keys 12A and 12B have been inserted through board holes 25 and 26, respectively, into keyholes 13B and 13A, respectively. The connectors are fastened together with a portion of the circuit board therebetween and the assembly is completed. Again, as in FIGS. 1A and 1C, the details of the fastening shapes of the keys 12A and 12B and the keyholes 13A and 13B are not shown in FIGS. 2A and 2B. The keys 12A and 12B and keyholes 13A and 13B can be any appropriate shapes. The dimensions of connectors 10A and 10B and of keys 12A and 12B are such that when the connectors 10A and 10B are mounted on the printed circuit board 24, the keys 12A and 12B are in tension sufficient to hold the connectors 10A and 10B firmly and snugly against the adjacent surfaces of board 24.

Figure 3:
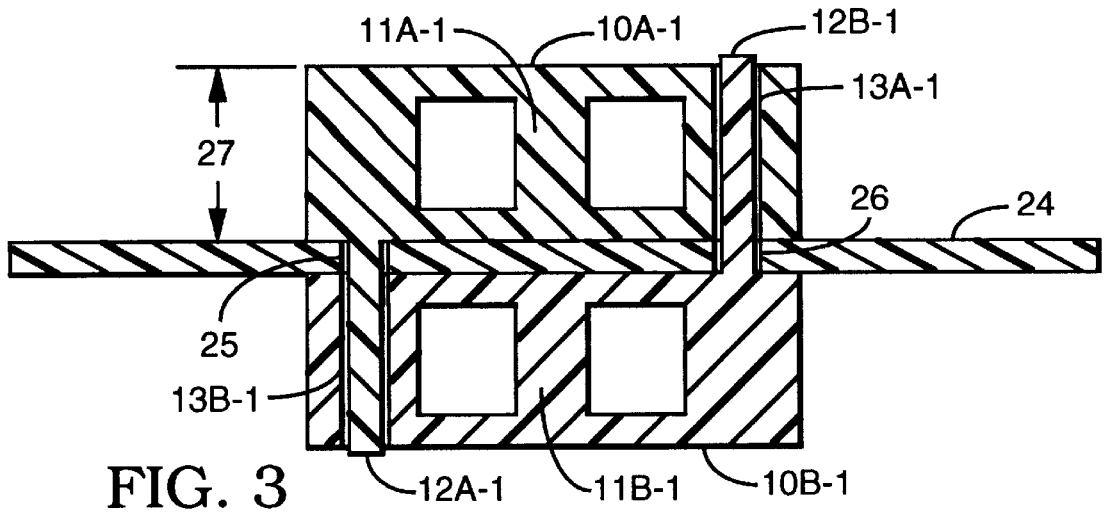
FIG. 3 shows a cross section, taken after assembly, of two connectors on a circuit board. The connectors are a first modified version in accordance with the invention.

FIG. 3 shows a cross section of a first modified version of connectors 10A-1 and 10B-1 assembled on a circuit board 24. The connectors in FIG. 3 do not have flanges like the flanges 17 and 18 shown in FIG. 1B; rather, the body 111A-1 of the connector 10A-1 has a uniform thickness, shown by the double arrow 27, extending to the left and to the right. In FIG. 3 the keys 12A-1 and 12B-1 are shown extending all the way through the through keyholes 13B-1 and 13A-1, respectively. Keys 12A-1 and 12B-1 contain appropriate structure (such as shown in FIGS. 6A, 6B, 7 and 8) for locking the keys 12A-1 and 12B-1 in keyholes 13B-1 and 13A-1 respectively.

Figure 4:
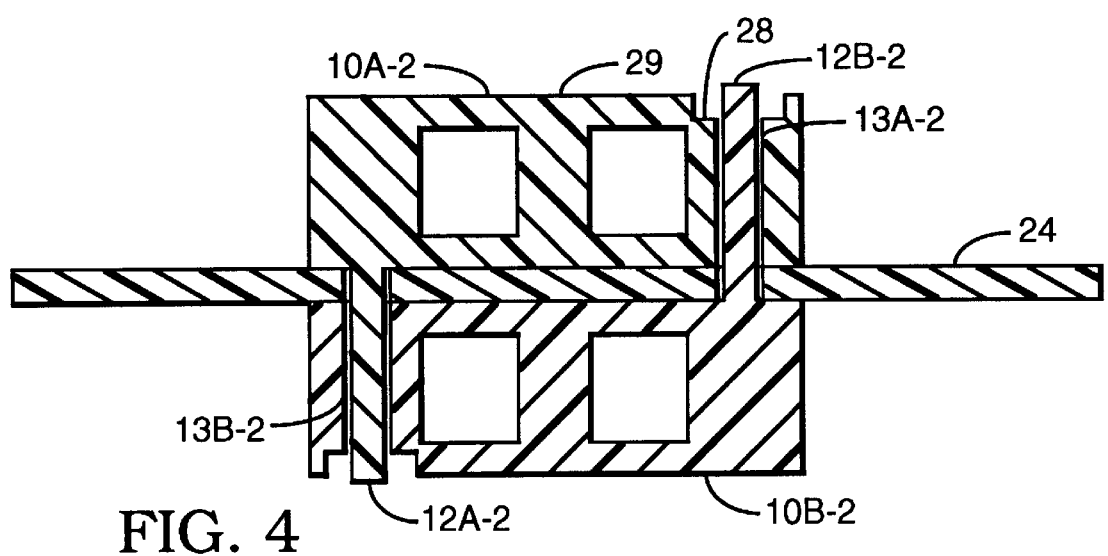
FIG. 4 shows a cross section, taken after assembly, of two connectors on a circuit board. The connectors are a second modified version in accordance with the invention.

FIG. 4 shows a cross section of a second modified version of connectors 10A-2 and 10B-2 assembled on a circuit board 24. These connectors do not have flanges like the flanges 17 and 18 shown in FIG. 1B. The keyhole 13A-2 has a shoulder 28 where the diameter of the keyhole changes. The key 12B-2 terminates within the portion of larger diameter of keyhole 13A-2 and the key 12B-2 does not protrude beyond the top surface 29 of the connector 10A-2. The configuration of key 12A-2 in connector 10B-2 is similar to that just described. Both keys 12B-2 and 12A-2 have a structure (such as shown in FIGS. 6A, 6B, 7 and 8) which locks the keys in keyholes 13A-2 and 13B-2 respectively.

Figure 5:
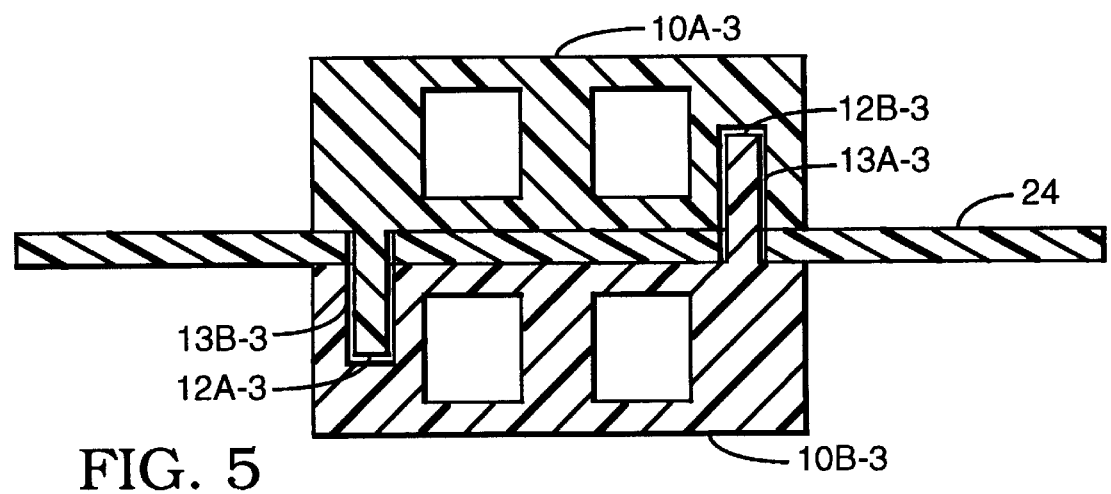
FIG. 5 shows a cross section, taken after assembly, of two connectors on a circuit board. The connectors are a third modified version in accordance with the invention.

FIG. 5 shows a cross section of a third modified version of connectors 10A-3 and 10B-3 assembled on a circuit board 24. In this version the keyholes 13A-3 and 13B-3 are blind holes rather than the through holes of the previous versions. The keys 12A-3 and 12B-3 are short enough to fit within the blind keyholes 13B-3 and 13A-3 respectively. Both keys 12A-3 and 12B-3 have a structure (such as shown in FIGS. 6A, 6B, 7 and 8) which locks the keys in keyholes 13B-3 and 13A-3, respectively.

FIGS. 6A, 6B, 7 and 8 show, in more detail, cross sections of some key and keyhole configurations in accordance with the present invention.

Figure 6A:
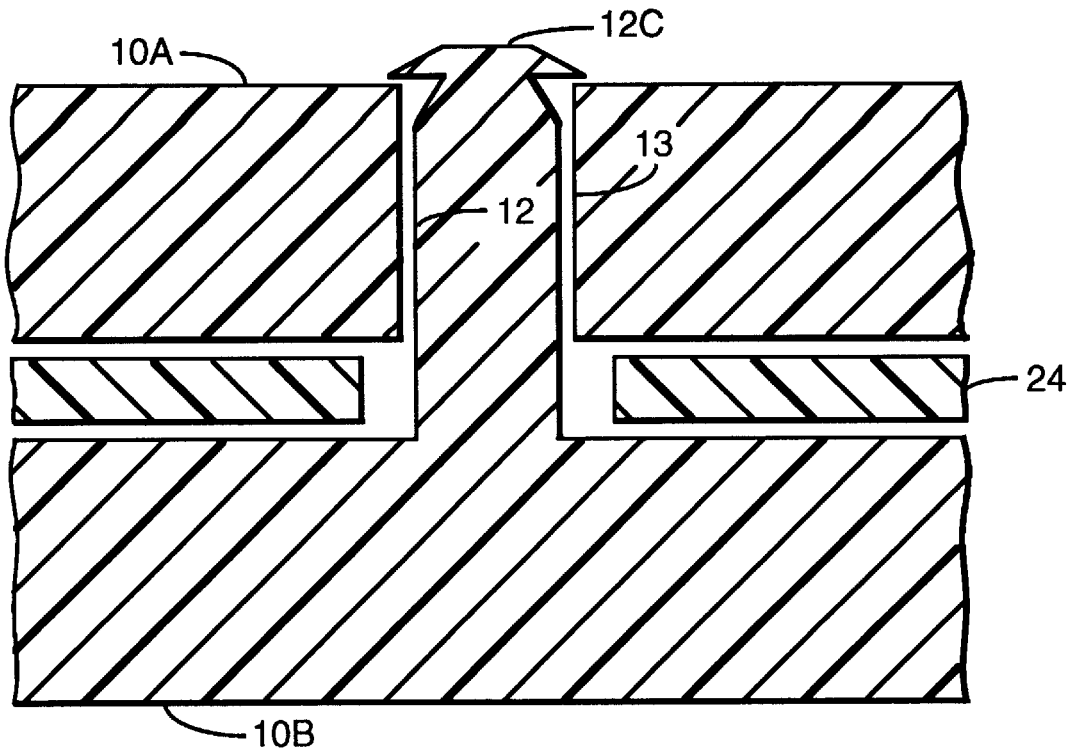
FIG. 6A shows a cross section of a key and keyhole configuration for a connector in accordance with the invention.

FIG. 6A shows a cross section of a key 12, a keyhole 13 and portions of connector 10A, connector 10B and board 24. In FIG. 6A, the keyhole 13 is a straight through hole. The key 12 is made of a pliable resilient material. The head 12C of the key 12 has a diameter larger than the keyhole 13. The head 12C deforms to pass through the keyhole 13 and then recovers its normal shape as shown to prevent removal of the key 12.

Figure 6B:
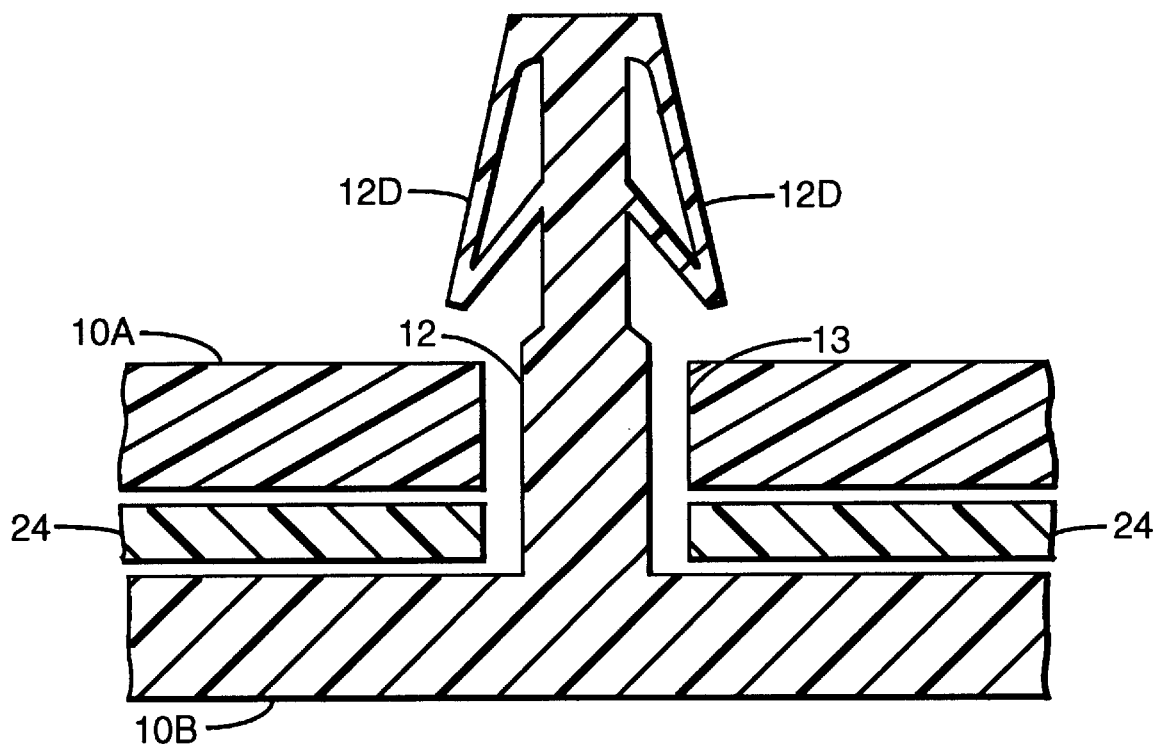
FIG. 6B shows a cross section of a key and keyhole configuration for a connector in accordance with the invention.

FIG. 6B shows a cross section of a key 12, a keyhole 13 and portions of connector 10A, connector 10B and board 24. Arms 12D, which extend to the left and right of the key 12, remain in a closed position next to the key 12 while the key is being passed through keyhole 13, and then expand to the position shown in FIG. 6B.

Figure 7:
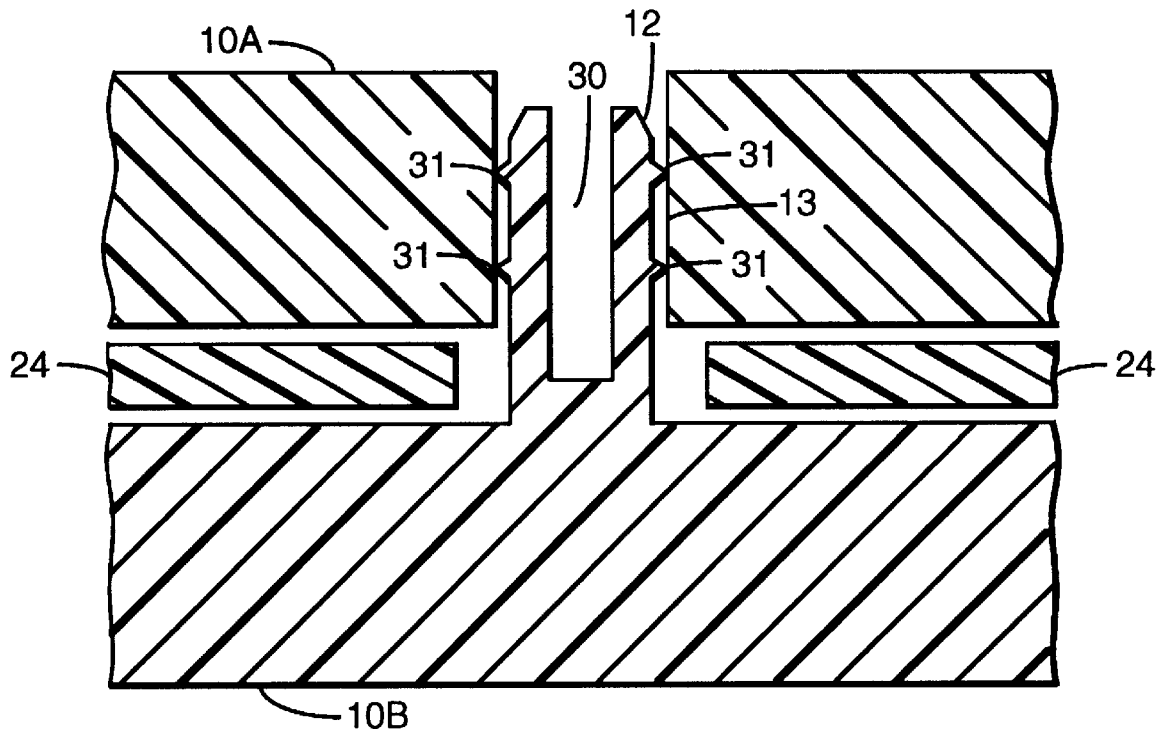
FIG. 7 shows a cross section of a key and keyhole of a second configuration for a connector in accordance with the invention.

FIG. 7 shows a cross section similar to that shown in FIG. 6A except that the key 12 has been modified. The key 12 in FIG. 7 is a split key with a central slot 30 which allows the key to contract as it enters the keyhole 13. The protrusions 31 are forced against the inside of the keyhole 13 by the spring action of the compressed key 12 and thus hold the key in place. In one embodiment, indentations can be provided on the inner surface of keyhole 13 to receive and lock in place protrusions 31 and thus lock in place key 12.

Figure 8:
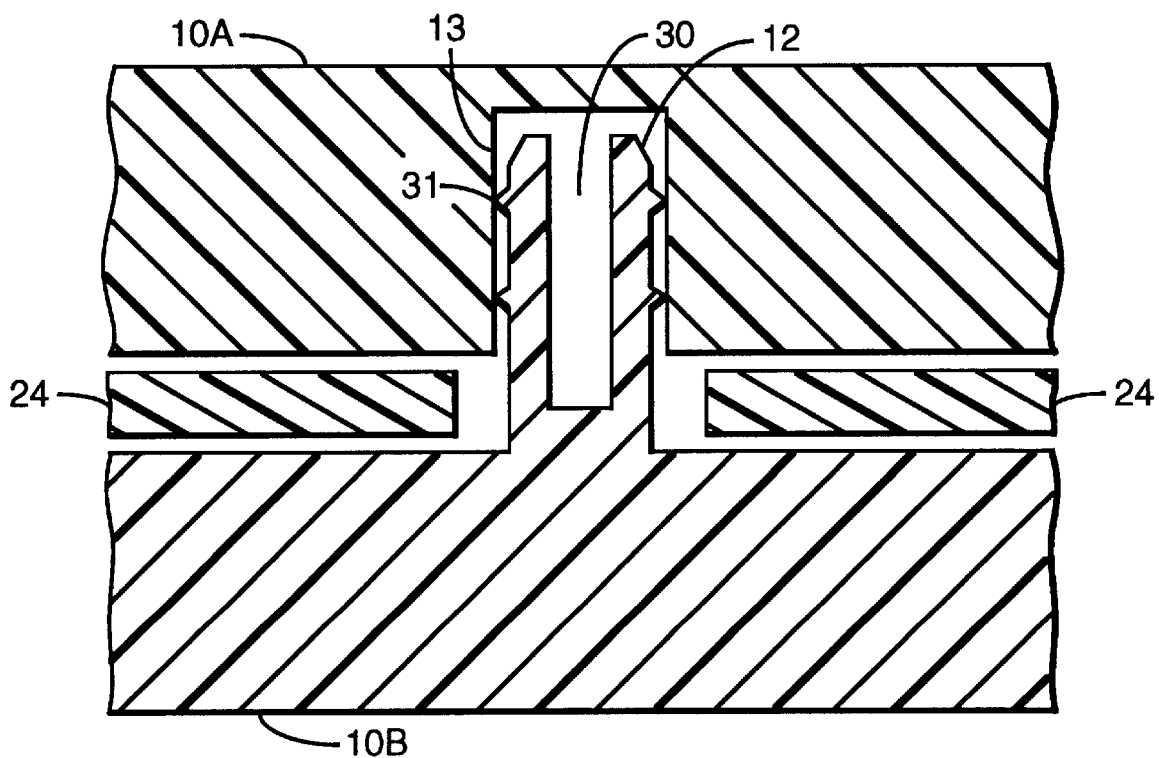
FIG. 8 shows a cross section of a key and keyhole of a third configuration for a connector in accordance with the invention.

FIG. 8 shows a cross section similar to that shown in FIG. 7 except that the keyhole here is a blind hole. In FIG. 8 as in FIG. 7 the spring action of a split key 12 presses the protrusions 31 against the keyhole and holds the key 12 in place. Again, indentations can be provided on the inner surface of keyhole 13 to receive and lock in place protrusions 31 and thus lock in place key 12.

Figure 9:
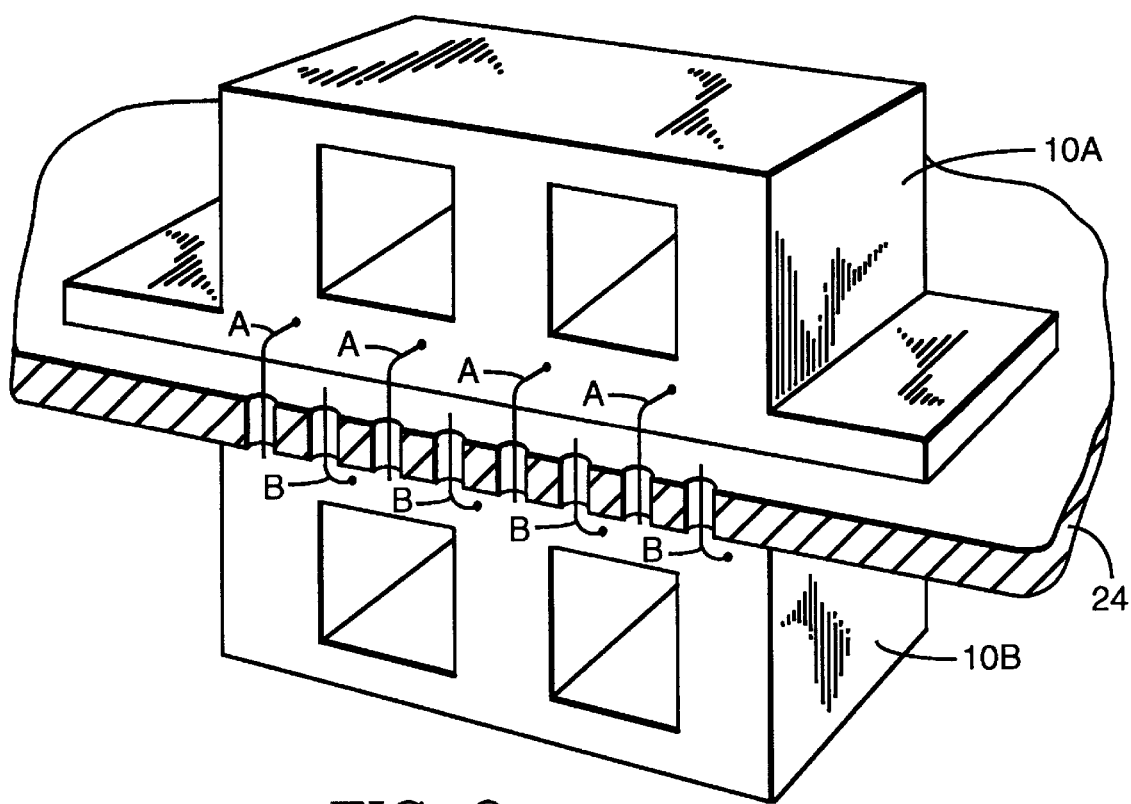
FIG. 9 shows a perspective view of two connectors attached to a circuit board and shows a cross section of the board showing a staggered arrangement of through-the-board leads.

FIG. 9 shows a perspective view of two connectors attached to a circuit board in accordance with the present invention and shows a partial cross section through the circuit board 24 to show how through-the-board leads may be arranged in staggered form with the leads A of connector 10A alternating with the leads B of connector 10B.

The foregoing detailed description is given by way of illustration and example only, the scope of the present invention being limited only by the appended claims.

I claim:

1. An assembly comprising:

a circuit board having a first surface and a second surface opposite the first surface;

a first connector comprising a first key with a first head and a first keyhole formed completely through the first connector; and a second connector comprising a second key with a second head and a second keyhole formed completely through the second connector;

wherein the first connector is located on the first surface and the second connector is located on the second surface and the first key is in and passes completely through the second keyhole such that the second connector is firmly and snugly held in position relative to the first connector and the second key is in and passes completely through the first keyhole such that the first connector is firmly and snugly held in position relative to the second connector so that the first and second connectors are fastened together with a portion of the circuit board therebetween.

2. The assembly of claim 1 wherein the first connector comprises surface mount pins forced against traces on the circuit board and the second connector comprises surface mount pins forced against traces on the circuit board.

3. The assembly of claim 1 wherein the first connector comprises a plurality of keyholes and keys and the second connector comprises a plurality of keyholes and keys.

4. The assembly of claim 1 wherein the circuit board has a first through-hole for the first key and a second through-hole for the second key.

5. The assembly of claim 1 wherein the first connector comprises a plurality of through-the-board leads and the second connector comprises a plurality of through the board leads and wherein the board comprises through-holes for the leads, said through-holes being in a linear array, and wherein the leads of the first connector and the leads of the second connector are in alternate through-holes.

6. An assembly of claim 1, wherein said first head protrudes beyond said second keyhole, and second head protrudes beyond said first keyhole, so that the connectors are locked together with a portion of the circuit board therebetween.

7. An assembly of claim 1, wherein said first and second heads are made of pliable resilient material, said first head in its natural state is larger in a lateral dimension than a corresponding dimension of said second keyhole, said second head in its natural state is larger in a lateral dimension than a corresponding dimension of said first keyhole, said first head protrudes beyond said second keyhole so as to lock said second connector to said first connector, and second head protrudes beyond said first keyhole so as to lock said first connector to said second connector.

8. The assembly of claim 1 wherein the first head has a lateral dimension larger than a lateral dimension of said second keyhole and the second head has a lateral dimension larger than a lateral dimension of said first keyhole.

9. A pair of connectors wherein each connector comprises:

a connector body having a key with a head extending outward and having a keyhole, the head being resilient and having a lateral dimension greater than a lateral diameter of the corresponding keyhole, the keyhole being spaced apart from the key, so that the connectors can be joined by inserting the key of each connector into the keyhole of the other connector such that the head of each key attached to one connector resiles to lock together the pair of connectors.

10. The pair of connectors of claim 9 wherein each connector comprises leads for attachment to printed circuit board traces.

11. The pair of connectors of claim 10 wherein said leads are surface mount pins.

12. The pair of connectors of claim 9 wherein said leads are through-the-board leads.

13. The pair of connectors of claim 9 wherein at least one of the pair of connectors comprises at least one RJ-45 connector.

14. The pair of connectors of claim 9 wherein the pair of connectors can be joined with a printed circuit board between.

15. A pair of connectors of claim 6, wherein each head has a portion with a dimension greater than a dimension of the corresponding keyhole so that when the pair of connectors is assembled together the head of the key on one connector protrudes through and beyond a corresponding keyhole on the other connector to lock each of the connectors to the other.

16. A pair of connectors of claim 15, wherein each head is made of pliable resilient material, each head in its natural state is larger in a radial dimension than the keyhole into which the key is fitted, such that when the connectors are assembled together, the head is larger in a radial dimension to lock each key in its corresponding keyhole and thus to lock each connector to the other.

* * * * *